United States Patent
Li et al.

(10) Patent No.: US 10,730,226 B2
(45) Date of Patent: Aug. 4, 2020

(54) METHOD FOR PREPARING PYROELECTRIC POLYMER FILM BASED ON COMBINED PROCESS OF SOLUTION CASTING AND UNIAXIAL STRETCHING

(71) Applicant: University of Electronic Science and Technology of China, Chengdu, Sichuan (CN)

(72) Inventors: Weizhi Li, Sichuan (CN); Jimeng Li, Sichuan (CN); Yuming Wu, Sichuan (CN); Xiaosong Du, Sichuan (CN); Huiling Tai, Sichuan (CN); He Yu, Sichuan (CN)

(73) Assignee: University of Electronic Science and Technology of China, Chengdu, Sichuan (CN)

( * ) Notice: Subject to any disclaimer, the term of this patent is extended or adjusted under 35 U.S.C. 154(b) by 217 days.

(21) Appl. No.: 15/893,678

(22) Filed: Feb. 11, 2018

(65) Prior Publication Data
US 2018/0186060 A1    Jul. 5, 2018

(30) Foreign Application Priority Data
Dec. 14, 2017    (CN) .......................... 2017 1 1336946

(51) Int. Cl.
*B29C 55/04*    (2006.01)
*C08J 5/18*    (2006.01)
(Continued)

(52) U.S. Cl.
CPC ............ *B29C 55/04* (2013.01); *B29C 41/003* (2013.01); *B29C 41/02* (2013.01); *B29C 41/46* (2013.01);
(Continued)

(58) Field of Classification Search
CPC ....... B29C 55/04; B29C 55/005; B29C 41/02; B29C 41/003; B29C 41/46; B29C 41/50;
(Continued)

(56) References Cited

U.S. PATENT DOCUMENTS 2,059,284 A * 11/1936 Schade .................. B29C 35/02
525/332.6
2,163,784 A *  6/1939 Gammeter ............. B29C 41/14
264/347
(Continued)

FOREIGN PATENT DOCUMENTS

CN    106528497 A  *  3/2017  ............... B05D 3/12
GB        936398 A  *  9/1963  ........... B29C 55/005

*Primary Examiner* — Xiao S Zhao
*Assistant Examiner* — John J Derusso

(57) ABSTRACT

A method for preparing a pyroelectric polymer film based on a combined process of solution casting and uniaxial stretching is disclosed. The pyroelectric polymer film is firstly prepared by solution casting, afterwards, the casted film is subjected to uniaxial stretching when the film is in a semi-cured state (wet film). Thus a larger stretching ratio (>10) at a lower temperature (even at room temperature) is realized. Without undergoing a further poling process, the as-stretched film does have a fairly, good pyroelectric performance. Moreover, the surface of the stretched film is smoother and has fewer surface defects.

8 Claims, 2 Drawing Sheets

(51) Int. Cl.
*B29C 41/00* (2006.01)
*B29C 41/02* (2006.01)
*B29C 41/46* (2006.01)
*B29C 55/00* (2006.01)
*B29L 7/00* (2006.01)
*B29K 27/00* (2006.01)
*B29K 105/00* (2006.01)

(52) U.S. Cl.
CPC ............ *B29C 55/005* (2013.01); *C08J 5/18* (2013.01); *B29K 2027/16* (2013.01); *B29K 2105/0073* (2013.01); *B29K 2995/0003* (2013.01); *B29L 2007/008* (2013.01); *C08J 2327/16* (2013.01); *C08J 2327/20* (2013.01)

(58) Field of Classification Search
CPC . B29C 41/52; B29C 35/0288; B29C 35/0222; B29C 55/02; B29C 55/045; B29C 41/12; B29C 39/02; B29C 39/04; B29K 2995/0003; H01L 41/45; H01L 41/193; B29D 7/01
See application file for complete search history.

(56) References Cited

U.S. PATENT DOCUMENTS

| | | | | | |
|---|---|---|---|---|---|
| 2,405,008 | A | * | 7/1946 | Berry | D06M 13/425 8/115.58 |
| 2,953,818 | A | * | 9/1960 | Bartron | B29C 48/08 264/178 R |
| 3,081,208 | A | * | 3/1963 | Bottorf | C08J 5/18 428/131 |
| 3,139,470 | A | * | 6/1964 | Prengle | B29C 55/143 264/232 |
| 3,197,538 | A | * | 7/1965 | Capron | D01F 6/12 264/235.6 |
| 3,325,330 | A | * | 6/1967 | Robb | B29C 55/023 156/229 |
| 3,376,370 | A | * | 4/1968 | Koblitz | C08L 27/16 264/184 |
| 3,751,531 | A | * | 8/1973 | Foster | B29C 55/12 264/456 |
| 3,931,446 | A | * | 1/1976 | Murayama | B29C 71/0063 428/421 |
| 3,965,232 | A | * | 6/1976 | Chion | D01F 6/12 264/184 |
| 4,344,908 | A | * | 8/1982 | Smith | B29C 70/10 264/203 |
| 4,448,742 | A | * | 5/1984 | Kromrey | B28B 19/0023 264/270 |
| 4,600,633 | A | * | 7/1986 | Kono | B29C 55/005 264/204 |
| 4,868,284 | A | * | 9/1989 | Murase | C08G 61/123 528/481 |
| 4,935,181 | A | * | 6/1990 | Theophilou | B29C 39/02 252/500 |
| 4,948,544 | A | * | 8/1990 | Van Unen | B29C 55/005 264/204 |
| 4,966,803 | A | * | 10/1990 | Pluyter | B29C 55/005 156/155 |
| 5,171,632 | A | * | 12/1992 | Heeger | B29C 55/005 428/364 |
| 5,217,650 | A | * | 6/1993 | Theophilou | B29C 39/02 252/500 |
| 5,310,866 | A | * | 5/1994 | Rutten | B29C 55/005 264/164 |
| 5,498,371 | A | * | 3/1996 | Schellekens | C08G 61/123 252/500 |
| 7,436,099 | B2 | * | 10/2008 | Pei | H01L 41/0536 310/311 |
| 8,829,121 | B2 | * | 9/2014 | Yoshida | H01L 41/45 252/62.9 R |
| 10,384,231 | B2 | * | 8/2019 | Swanson | B05D 3/12 |
| 2009/0127734 | A1 | * | 5/2009 | Nozawa | H01L 41/45 264/209.1 |
| 2009/0134538 | A1 | * | 5/2009 | Takita | B29C 55/005 264/28 |
| 2009/0146334 | A1 | * | 6/2009 | Takita | B01D 67/0027 264/41 |
| 2015/0048540 | A1 | * | 2/2015 | Hatakeyama | B29C 55/045 264/165 |
| 2016/0152946 | A1 | * | 6/2016 | Choi | C08J 5/00 425/383 |
| 2018/0009136 | A1 | * | 1/2018 | Rawlings | B32B 37/203 |
| 2018/0086011 | A1 | * | 3/2018 | Blink | B29C 70/70 |
| 2018/0366709 | A1 | * | 12/2018 | Mizuno | H01M 2/145 |

* cited by examiner

METHOD FOR PREPARING PYROELECTRIC POLYMER FILM BASED ON COMBINED PROCESS OF SOLUTION CASTING AND UNIAXIAL STRETCHING

CROSS REFERENCE OF RELATED APPLICATION

The present invention claims priority under 35 U.S.C. 119(a-d) to CN 201711336946.5, filed Dec. 14, 2017.

BACKGROUND OF THE PRESENT INVENTION

Field of Invention

The present invention relates to a technical field of piezoelectric material to preparation, and more particularly to a method for preparing a pyroelectric polymer film based on a combined process of solution casting and uniaxial stretching.

Description of Related Arts

Poly(vinylidene fluoride) (PVDF) and its copolymers are a class of functional materials with piezoelectric, pyroelectric and ferroelectric properties that are typically prepared as films for being used in a wide variety of devices. It is well known that the dielectric, pyro, and piezoelectric properties of PVDF like polymers depend not only on crystalline phase content, but also on crystallite orientation distribution and particularly on dipole orientation which are determined by the film preparation process and the constituents of the copolymers. The typical polymer film preparation process mainly includes three independent steps: 1) film formation, 2) stretching and 3) poling, in which the film forming process is further subdivided into four methods of a) solution casting, b) solution spilling, c) hot pressing and d) melt extruding. However, no matter which method is used to form the film, the piezoelectric/pyroelectric phase (i.e., $\beta$ phase) content in the as-formed film is usually low although some exceptions also exist. Thus the as-formed film is usually needed to undergo the stretching process to increase the piezoelectric phase content and crystallite orientation. Nevertheless, dipole orientation in the as-stretched film is still random distributed in the plane perpendicular to the stretching direction thus contributing to a net remanent polarization of zero. Therefore, the stretched film also needs to go through the poling process to improve dipole orientation of the polymer film, thereby increasing the remanent polarization of the film, so as to enhance the piezoelectric, pyroelectric and ferroelectric properties of the material. Please refer to literature ① Effect of drawing on the dielectric properties and polarization of pressed solution cast $\beta$-PVDF films, *J Mater Sci*, 2010, 45: 4206-4215. It reported that the solution casted PVDF film with proper solvent and temperature crystalize to 100% $\beta$ phase. Subsequently, the $\beta$ phase is preferentially oriented by uniaxial stretching. However, a poling step can not be avoided before measuring the hysteresis loop.

The conventional stretching process for piezoelectric polymer films is usually as follows: cutting the piezoelectric polymer film (formed by casting, extruding, and so on) into sheets, fixing both ends with clamps, putting on a stretching machine, and then heating the film to an elevated temperature; after the temperature is constant, the film is stretched according to the predetermined stretching speed and stretching length, then the stretching temperature is maintained for a certain time, and finally the film is cooled down to an appropriate temperature under a constant stretching force, so as to obtain the stretched film. In principle, the higher the stretching ratio, the higher the piezoelectric phase content. However, the conventional stretching process can not achieve a stretching ratio higher than 5 since the polymer films used to stretch are fully cured materials. To facilitate the stretching process, the polymer films must be stretched at a higher temperature, whereas the high temperature leads to the degradation of the $\beta$ phase. Please refer to literature ② Influence of the $\beta$-phase content and degree of crystallinity on the piezo and ferroelectric properties of poly(vinylidenefluoride), *Smart Mater. Struct.*, 2010, 19:065010. It reported that it was not possible to stretch the film samples at temperatures lower than 80° C. due to breaking of the samples. And at a higher temperature, the transformation efficiency from $\alpha$ to $\beta$ phase reduced, thereby reducing the piezoelectric/pyroelectric properties of the film. As a result, the maximum amount of $\beta$-phase was obtained by stretching at 80° C. with stretch ratios of 5.

It can be seen from the above that the conventional stretching process is an independent process step among the whole polymer film preparation procedure. The polymer films to be stretched are fully cured films prepared in the previous process (casting, hot pressing and extending), so the stretching ratio is low and the stretched films need to undergo the following poling process for piezoelectric, pyroelectric and ferroelectric applications.

SUMMARY OF THE PRESENT INVENTION

Based on the above analysis, the present invention is directed to the low stretching ratio and the high stretching temperature of the conventional stretching process. Therefore, the present invention provides a method for preparing a pyroelectric polymer film based on a combined process of solution casting and uniaxial stretching, wherein the pyroelectric polymer film is firstly prepared by solution casting, then the casted film is subjected to uniaxial stretching when the film is in a semi-cured state (wet film). Thus a larger stretching ratio at a lower temperature is realized. Without undergoing a further poling process, the as-stretched film does have a fairly good pyroelectric performance. Moreover, the surface of the stretched film is smoother and has fewer surface defects.

Accordingly, in order to accomplish the above objects, the present invention provides a method for preparing a pyroelectric polymer film based on a combined process of solution casting and uniaxial stretching, comprising steps of: preparing a pyroelectric polymer solution using a proper organic solvent, casting the pyroelectric polymer solution into a liquid film, and controlling a casting temperature and a casting time for volatilizing a part of the solvent in the liquid film to form a semi-cured wet film; then stretching the semi-cured wet film and waiting until the stretched film is completely cured, so as to obtain the pyroelectric polymer film.

Preferably, a pyroelectric polymer is a polymer selected from a group consisting of poly(vinylidene fluoride), poly(vinylidene fluoride-trifluoroethylene) polymer, and poly(vinylidene fluoride-hexafluoropropylene).

Preferably, a mass percentage of a pyroelectric polymer in the pyroelectric polymer solution is 10%-35%.

Preferably, controlling the casting temperature and the casting time for volatilizing part of the solvent of the pyroelectric polymer solution to form the semi-cured wet film is specifically executed with the casting temperature of 45-55° C. and the casting time of 0.5-5 h for the pyroelectric polymer solution of N-methyl pyrrolidone.

Preferably, controlling the casting temperature and the casting time for volatilizing part of the solvent of the pyroelectric polymer solution to form the semi-cured wet film is specifically executed with the casting temperature of 45-55° C. and the casting time of 0.25-2.5 h for the pyroelectric polymer solution of N,N-methylformamide.

Preferably, controlling the casting temperature and the casting time for volatilizing part of the solvent of the pyroelectric polymer solution to form the semi-cured wet film is specifically executed with the casting temperature of 55-65° C. and the casting time of 0.5-4 h for the pyroelectric polymer solution of N-methyl pyrrolidone.

Preferably, controlling the casting temperature and the casting time for volatilizing part of the solvent of the pyroelectric polymer solution to form the semi-cured wet film is specifically executed with the casting temperature of 55-65° C. and the casting time of 0.2-2 h for the pyroelectric polymer solution of N,N-methylformamide.

Preferably, a stretching temperature is 20-80° C.

The present invention also provides an apparatus for preparing a pyroelectric polymer film based on a combined process of solution casting and uniaxial stretching, comprising a first plate connected to a temperature control device, wherein a second plate and a third plate are arranged on the top side of the first plate; the second plate is fixed on the first plate, and the third plate is adjacent to the second plate and can be horizontally moved away from the second plate.

Preferably, the third plate is connected to a transmission device, so as to horizontally move away from the second plate.

The present invention also provides a method for preparing a pyroelectric polymer film based on the above apparatus, comprising steps of: casting a pyroelectric polymer solution into a liquid film at a border area across the second plate and the third plate, and controlling a casting temperature and a casting time by the temperature control device for volatilizing a part of the solvent in the liquid film to form a semi-cured wet film; then stretching the semi-cured wet film by moving the third plate, in such a manner that the semi-cured wet film under stretching drops and adheres to a top surface of the first plate by gravity; and adjusting the temperature control device for volatilizing all of the solvent in the stretched film, so as to obtain the pyroelectric polymer film.

Preferably, the third plate is specifically moved by a transmission device connected to the third plate.

Preferably, a pyroelectric polymer is a polymer selected from a group consisting of poly(vinylidene fluoride), poly(vinylidene fluoride-trifluoroethylene) polymer, and poly(vinylidene fluoride-hexafluoropropylene).

Preferably, a mass percentage of a pyroelectric polymer in the pyroelectric polymer solution is 10%-35%.

Preferably, controlling the casting temperature and the casting time for volatilizing part of the solvent of the pyroelectric polymer solution to form the semi-cured wet film is specifically executed with the casting temperature of 45-55° C. and the casting time of 0.5-5 h for the pyroelectric polymer solution of N-methyl pyrrolidone.

Preferably, controlling the casting temperature and the casting time for volatilizing part of the solvent of the pyroelectric polymer solution to form the semi-cured wet film is specifically executed with the casting temperature of 45-55° C. and the casting time of 0.25-2.5 h for the pyroelectric polymer solution of N,N-methylformamide.

Preferably, controlling the casting temperature and the casting time for volatilizing part of the solvent of the pyroelectric polymer solution to form the semi-cured wet film is specifically executed with the casting temperature of 55-65° C. and the casting time of 0.5-4 h for the pyroelectric polymer solution of N-methyl pyrrolidone.

Preferably, controlling the casting temperature and the casting time for volatilizing part of the solvent of the pyroelectric polymer solution to form the semi-cured wet film is specifically executed with the casting temperature of 55-65° C. and the casting time of 0.2-2 h for the pyroelectric polymer solution of N,N-methylformamide.

Preferably, a stretching temperature is 20-80° C.

Compared with the prior art, the beneficial effects of the present invention are as follows.

In the present invention, the solution casted pyroelectric polymer film in the semi-cured state is stretched. Compared with the conventional stretching process using fully cured film, the stretchability of the semi-cured film is much higher. Thus, a higher stretching ratio (>10) can be readily obtained under a lower temperature (even at room temperature). The resistance between the semi-cured pyroelectric polymer molecules is much smaller than that between the fully cured film molecules, thus the pyroelectric polymer molecules under stretching can overcome the intermolecular resistance, so as to achieve the orderly orientation of the piezoelectric crystal phase. In addition, the stretching is carried out at a relative low temperature, so that the orientation of the dipole is not prone to depolarization, guaranteeing that the dipole in the dried film material still maintains the ordered orientation. Therefore, the pyroelectric polymer film prepared by the present invention has the pyroelectric response characteristics even without poling process.

These and other objectives, features, and advantages of the present invention will become apparent from the following detailed description, the accompanying drawings, and the appended claims.

Figure 1:
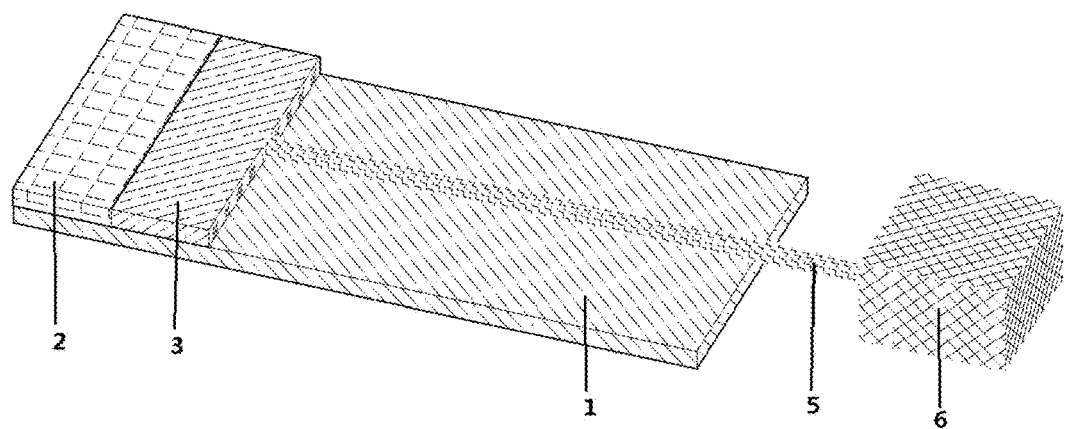
FIG. 1 is a structural view of an apparatus for preparing a pyroelectric polymer film according to the present invention.

Element reference: 1—forming plate, 2—fixed stretching plate, 3—movable stretching plate, 4—pyroelectric polymer film, 5—transmission device, 6—stepper motor.

DETAILED DESCRIPTION OF THE PREFERRED EMBODIMENT

Referring to the drawings, the present invention is further illustrated.

Referring to FIG. 1, the present invention provides an apparatus for preparing a pyroelectric polymer film, comprising a forming plate 1 connected to a temperature control device, wherein a fixed stretching plate 2 and a movable stretching plate 3 are arranged on the top side of the forming plate 1; the fixed stretching plate 2 is fixed on the forming plate 1; and the movable stretching plate 3 is adjacent to the fixed stretching plate 2. The movable stretching plate 3 is connected to a stepper motor 6 through a transmission device 5, namely the movable stretching plate 3 is able to horizontally move to away from the fixed stretching plate 2.

Figure 2:
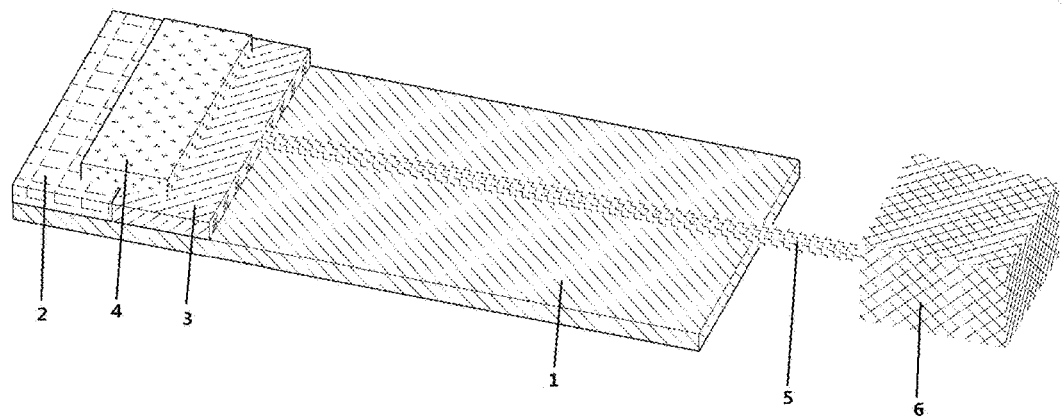
FIG. 2 is a schematic view illustrating a state before stretching according to the present invention.
Figure 3:
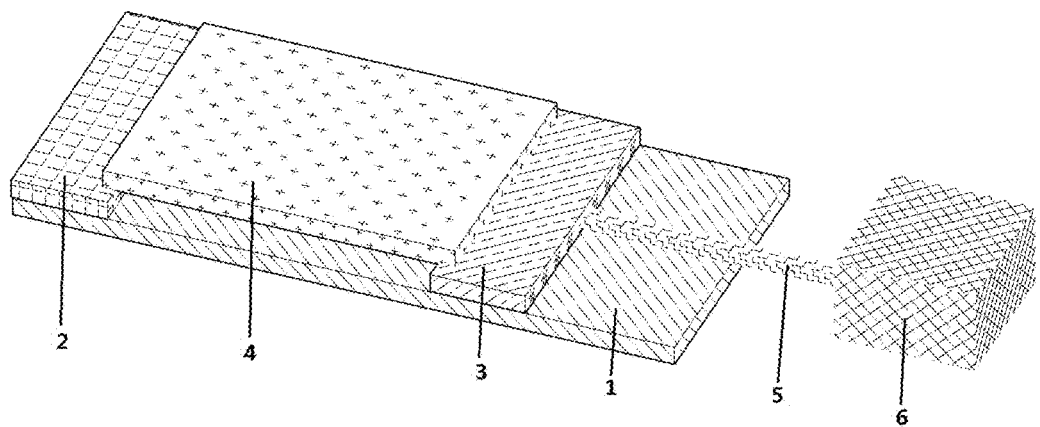
FIG. 3 is a schematic view illustrating a state during stretching according to e present invention.
Figure 4:
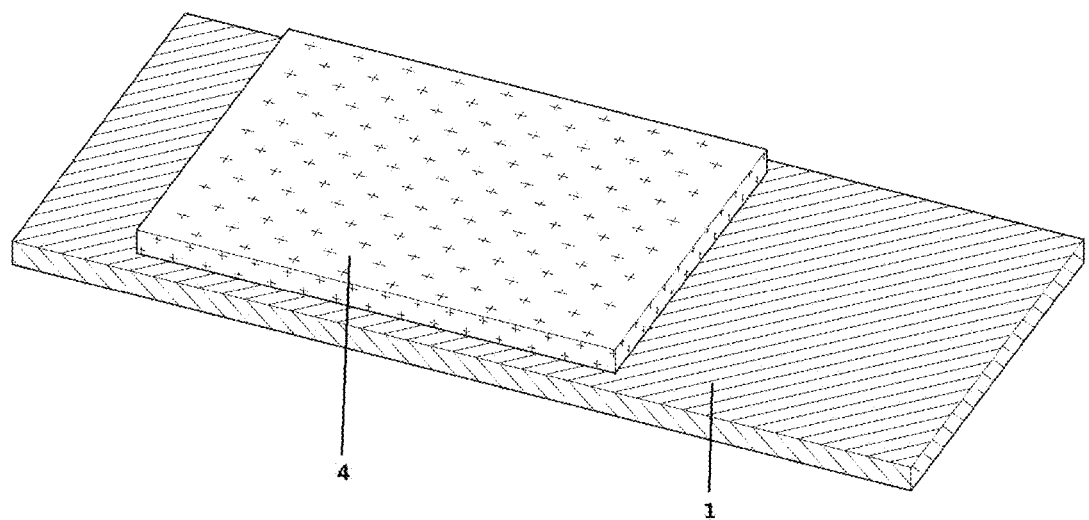
FIG. 4 is a schematic view illustrating a state after stretching according to the present invention.

A method for preparing the pyroelectric polymer film comprises steps of:

Step A: preparing a pyroelectric polymer solution;

wherein a pyroelectric polymer material and a solvent are properly selected according to actual requirements, and pyroelectric polymer powder or particle is dissolved in the proper solvent and then heated and evenly stirred to obtain the pyroelectric polymer solution;

Step B: establishing an apparatus;

wherein a forming plate 1 is horizontally placed on a temperature-controllable heating plate, a fixed stretching plate 2 is placed at one side of a top surface of the forming plate 1, and then a movable stretching plate 3 is placed beside the fixed stretching plate 2; the movable stretching plate 3 is closely contacted with the fixed stretching plate 2; the movable stretching plate 3 is connected to a stepper motor 6 through a transmission device 5, so as to be horizontally movable on the top surface of the forming plate 1 and away from the fixed stretching plate 2;

Step C: preparing the pyroelectric polymer film, comprising steps of:

casting the pyroelectric polymer solution at a border area across the fixed stretching plate 2 and the movable stretching plate 3, wherein FIG. 2 is a schematic view illustrating a state before stretching; controlling a casting temperature and a casting time by a temperature control device for semi-curing the pyroelectric polymer film, then turning on the stepper motor 6 to start the stretching process according to the predetermined stretching ratio and stretching speed, wherein FIG. 3 is a schematic view illustrating a state during stretching; the stretched film forms a highly even film on the forming plate 1 under gravity, and FIG. 4 is a schematic view illustrating a state after stretching; then adjusting the temperature control device for volatilizing the solvent in the stretched film, so as to obtain the pyroelectric polymer film.

In order to facilitate a clear and complete understanding of the technical solutions of the present invention, the principle and characteristics of the present invention are described in detail below with reference to specific embodiments.

Embodiment 1

Dissolving PVDF (polyvinylidene fluoride) powder in an NMP (N-methyl pyrrolidone) solvent with a mass ratio of 25:75, magnetically stirring for 12 h under 70° C. water bath, so as to fully dissolve the PVDF;

A forming plate 1 is horizontally placed on a temperature-controllable heating plate, a fixed stretching plate 2 is placed at one side of a top surface of the forming plate 1, and then a movable stretching plate 3 is placed beside the fixed stretching plate 2; the movable stretching plate 3 is closely contacted with the fixed stretching plate 2; the movable stretching plate 3 is connected to a stepper motor 6 through a transmission device 5; and Casting the pyroelectric polymer solution at a border area across the fixed stretching plate 2 and the movable stretching plate 3, setting a temperature of the temperature-controllable heating plate to 50° C. to heat the casted film for 4 h, thus volatilizing part of the solvent in the film so as to obtain a semi-cured wet film; stretching the wet film by horizontally moving the movable stretching plate 3 away from the fixed stretching plate 2 with a stretching length of 200 mm and a stretching speed of 400 mm/s controlled by the stepper motor 6 with a programmable servo controller, so as to stretch the film by 20 times and the stretched film forms a layer of even film on the forming plate 1; keeping the temperature of the temperature-controllable heating plate at 50° C. for fully volatilizing the solvent in the PVDF film, so as to complete preparation.

Figure 5:
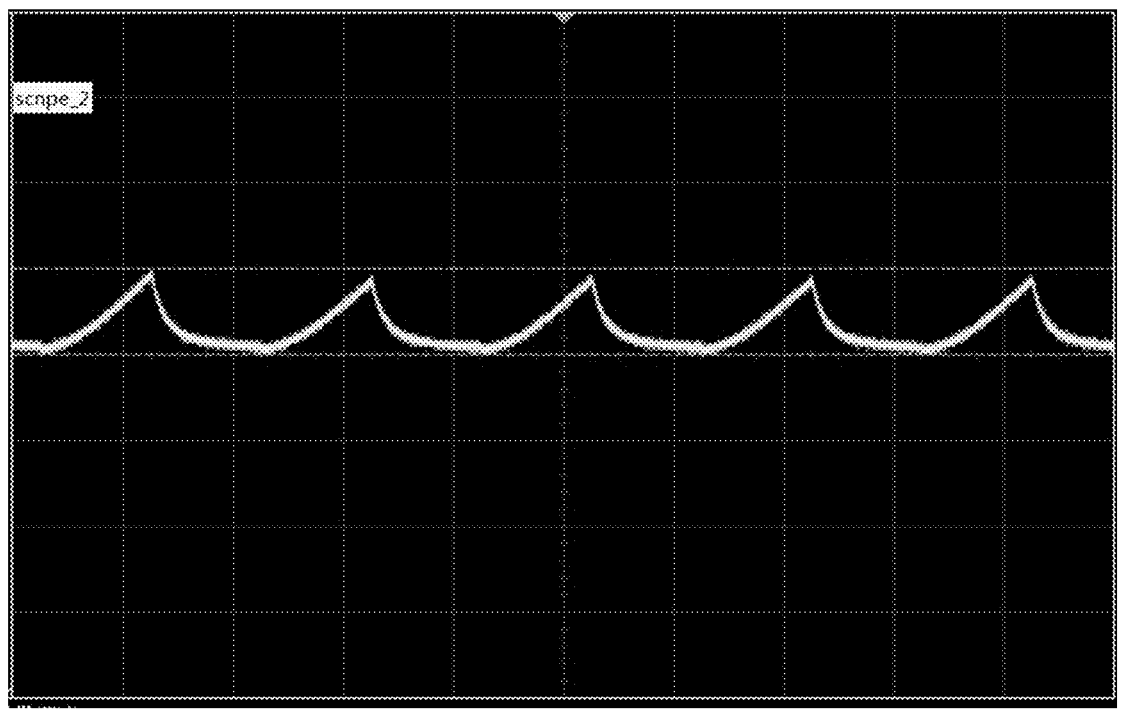
FIG. 5 is a typical oscilloscope record of pyroelectric responses of a pyroelectric polymer film prepared in an embodiment 1 according to the present invention, where Y scale is 500 mV/div and X scale is 0.5 s/div.

For testing pyroelectric response of the film prepared in the embodiment 1, both faces of the prepared. PVDF film are deposited with aluminum electrodes by vacuum evaporation, then the aluminum electrodes are connected to a signal amplifier through electric leads and the amplified pyroelectric signal is sent to an oscilloscope through a coaxial cable, A testing method comprises steps of:

A pulsed infrared laser is irradiated on the PVDF film prepared in the embodiment 1 to generate an alternating temperature field, adjusting a signal generator to control an output power and an output frequency of the infrared laser to be 20 mw and 1 Hz; thus pyroelectric currents are generated between the top electrode and the bottom electrode due to a temperature change on the surface of the PVDF film; as shown in FIG. 5, the pyroelectric response read by the oscilloscope has a frequency of 1 Hz. Thus, it proves that the stretched film prepared according to this embodiment possesses pyroelectric performance even without undergoing a poling process. It indicates that the dipole orientation in the as-stretched film by this method is no longer randomly distributed but preferred oriented.

Comparison Example

Preparing the same NMP solution of PVDF as illustrated in the embodiment 1, casting the solution on a forming plate, and drying at 90° C. for 4 h; then cutting the TWIN film into a rectangle sheet of 2 cm×4 cm; fixing the rectangular sheet on a GGP1204 optical axis ball linear slider (model: EBX1204-100) through a clamp; heating to 80° C. and then stretching by a matched 57-stepper motor with a stretching speed as slow as 0.5 mm/s and eventually reaching a stretching ratio of 5; keeping a stretching force and naturally cooling to a room temperature for completing the preparation process.

Testing a pyroelectric response with the same method as illustrated in the embodiment 1, and no response is detected.

Embodiment 2

Dissolving P(VDF-TrFE) (polyvinyledenedifluoride-trifluoroethylene) powder in a DMF (N,N-methylformamide) solvent with a mass ratio of 20:80, magnetically stirring for 12 h under 70° C. water bath, so as to fully dissolve the P(VDF-TrFE); and Establishing the same device as illustrated in the embodiment 1, casting the pyroelectric polymer solution at a border area across the fixed stretching plate 2 and the movable stretching plate 3, setting a temperature of the temperature-controllable heating plate to 55° C. to heat the casted film for 2 h, thus volatilizing part of the solvent in the film so as to obtain a semi-cured wet film; stretching the wet film by horizontally moving the movable stretching plate 3 away from the fixed stretching plate 2 with a stretching length of 150 mm and a stretching speed of 150 mm/s controlled by the stepper motor 6 with a programmable servo controller, so as to stretch the film by 15 times and the stretched film forms a layer of even film on the forming plate 1; keeping the temperature of the temperature-controllable heating plate at 55° C. for fully volatilizing the solvent in the P(VDF-TrFE) film, so as to complete preparation.

Testing pyroelectric response with the same method as illustrated in the embodiment 1, the pyroelectric response read by the oscilloscope has a frequency of 1 Hz.

Embodiment 3

Dissolving PVDF-HFP (Poly(vinylidene fluoride-co-hexafluoropropylene)) powder in a DMAC, (N,N-dimethylacetamide) solvent with a mass ratio of 35:65, magnetically stirring for 12 h under 70° C.' water bath, so as to fully dissolve the PVDF-HFP; and Establishing the same device as illustrated in the embodiment 1, casting the pyroelectric polymer solution at a border area across the fixed stretching plate 2 and the movable stretching plate 3, setting a temperature of the temperature-controllable heating plate to 60° C. to heat the casted film for 2 h, thus volatilizing part of the solvent in the film so as to obtain a semi-cured wet film; stretching the wet film by horizontally moving the movable stretching plate 3 away from the fixed stretching plate 2 with a stretching length of 100 mm and a stretching speed of 50 mm/s controlled by the stepper motor 6 with a programmable servo controller; so as to stretch the film by 10 times and the stretched film forms a layer of even film on the forming plate 1; keeping the temperature of the temperature-controllable heating plate at 60° C. for fully volatilizing the solvent in the PVDF-HFP film; so as to complete preparation.

Testing pyroelectric response with the same method as illustrated in the embodiment 1, the pyroelectric response read by the oscilloscope has a frequency of 1 Hz.

Embodiment 4

Dissolving PVDF (polyvinylidene fluoride) powder in an NMP (N-methyl pyrrolidone) solvent with a mass ratio of 35:65, magnetically stirring for 12 h under 70° C. water bath, so as to fully dissolve the PVDF; and Establishing the same device as illustrated in the embodiment 1, casting the pyroelectric polymer solution at a border area across the fixed stretching plate 2 and the movable stretching plate 3, setting a temperature of the temperature-controllable heating plate to 60° C. to heat the casted film for 0.5 h, thus volatilizing part of the solvent in the film so as to obtain a semi-cured wet film; stretching the wet film by horizontally moving the movable stretching plate 3 away from the fixed stretching plate 2 with a stretching length of 11.00 mm and a stretching speed of 200 mm/s controlled by the stepper motor 6 with a programmable servo controller, so as to stretch the film by 10 times and the stretched film forms a layer of even film on the forming plate 1; keeping the temperature of the temperature-controllable heating plate at 50° C. for fully volatilizing the solvent in the PVDF film, so as to complete preparation.

Testing pyroelectric response with the same method as illustrated in the embodiment 1, the pyroelectric response read by the oscilloscope has a frequency of 1 Hz.

One skilled in the art will understand that the embodiment of the present invention as shown in the drawings and described above is exemplary only and not intended to be limiting.

It will thus be seen that the objects of the present invention have been fully and to effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A method for preparing a pyroelectric polymer film based on a combined process of solution casting and uni-axial stretching, comprising steps of: preparing a pyroelectric polymer solution using an organic solvent, casting the pyroelectric polymer solution into a liquid film at a border area across a second plate and a third plate, and controlling a casting temperature and a casting time by a temperature control device for volatilizing a part of the solvent in the liquid film to form a semi-cured wet film; then stretching the semi-cured wet film by moving the third plate away from the second plate with a transmission device, in such a manner that the semi-cured wet film under stretching drops and adheres to a top surface of a first plate by gravity; adjusting the temperature control device for volatilizing all of the solvent in the stretched film and waiting until the stretched film is completely cured, so as to obtain the pyroelectric polymer film.

2. The method, as recited in claim 1, wherein a pyroelectric polymer is a polymer selected from a group consisting of poly(vinylidene fluoride), poly(vinylidene fluoride-trifluoroethylene) polymer, and poly(vinylidene fluoride-hexafluoropropylene).

3. The method, as recited in claim 1, wherein a mass percentage of a pyroelectric polymer in the pyroelectric polymer solution is 10%-35%.

4. The method, as recited in claim 1, wherein controlling the casting temperature and the casting time for volatilizing part of the solvent of the pyroelectric polymer solution to form the semi-cured wet film is specifically executed with the casting temperature of 45-55° C. and the casting time of 0.5-5 h for the pyroelectric polymer solution with N-methyl pyrrolidone as the organic solvent.

5. The method, as recited in claim 1, wherein controlling the casting temperature and the casting time for volatilizing part of the solvent of the pyroelectric polymer solution to form the semi-cured wet film is specifically executed with the casting temperature of 45-55° C. and the casting time of 0.25-2.5 h for the pyroelectric polymer solution with N,N-methylformamide as the organic solvent.

6. The method, as recited in claim 1, wherein controlling the casting temperature and the casting time for volatilizing part of the solvent of the pyroelectric polymer solution to form the semi-cured wet film is specifically executed with the casting temperature of 55-65° C. and the casting time of 0.5-4 h for the pyroelectric polymer solution with N-methyl pyrrolidone as the organic solvent.

7. The method, as recited in claim 1, wherein controlling the casting temperature and the casting time for volatilizing part of the solvent of the pyroelectric polymer solution to form the semi-cured wet film is specifically executed with the casting temperature of 55-65° C. and the casting time of 0.2-2 h for the pyroelectric polymer solution with N,N-methylformamide as the organic solvent.

8. The method, as recited in claim 1, wherein a stretching temperature is 20-80° C.

* * * * *